United States Patent
Ellens et al.

(10) Patent No.: US 6,674,233 B2
(45) Date of Patent: Jan. 6, 2004

(54) ILLUMINATION UNIT HAVING AT LEAST ONE LED AS LIGHT SOURCE

(75) Inventors: Andries Ellens, Den Haag (NL); Günter Huber, Schrobenhausen (DE)

(73) Assignee: Patent-Treuhand-Gesellschaft für Elektrische Glühlampen mbH, München (DE)

( * ) Notice: Subject to any disclaimer, the term of this patent is extended or adjusted under 35 U.S.C. 154(b) by 0 days.

(21) Appl. No.: 10/197,759

(22) Filed: Jul. 18, 2002

(65) Prior Publication Data

US 2003/0052595 A1 Mar. 20, 2003

(30) Foreign Application Priority Data

Sep. 20, 2001 (DE) .......................... 101 46 719

(51) Int. Cl.[7] .............................. H01J 1/62; C04B 35/00
(52) U.S. Cl. ...................................... 313/503; 501/98.1
(58) Field of Search .............................. 313/501, 502, 313/503; 501/98.1, 98.2, 98.3

(56) References Cited

U.S. PATENT DOCUMENTS 5,990,026 A * 11/1999 Baek et al. ............... 501/98.1
5,998,925 A * 12/1999 Shimizu et al. ........... 313/503
6,066,583 A * 5/2000 White ...................... 501/98.1

FOREIGN PATENT DOCUMENTS

| EP | 0862794 | 9/1996 |
|----|---------|--------|
| WO | WO 01/08453 | 7/1999 |

OTHER PUBLICATIONS

Krevel, "On new rare-earth doped M-Si-Al-O-N materials luminescence properties and oxidation resistance", Jan. 27, 2000, pp. 144-157.

* cited by examiner

*Primary Examiner*—Don Wong
*Assistant Examiner*—Minh D A
(74) *Attorney, Agent, or Firm*—Frishauf, Holtz, Goodman & Chick, P.C.

(57) ABSTRACT

An illumination unit having at least one LED as light source, the LED emitting primary radiation in the range from 300 to 430 nm, this radiation being completely converted into longer-wave radiation by phosphors which are exposed to the primary radiation of the LED, in which unit the conversion takes place at least with the aid of a phosphor which emits green with a peak emission wavelength at 495 to 540 nm and which originates from the class of the Ce-activated sialons, the sialon corresponding to the formula $M_{p/2}Si_{12-p-q}Al_{p+q}O_qN_{16-q}:Ce^{3+}$, where M=Ca individually or in combination with Sr, with q=0 to 2.5 and p=0.5 to 3.

13 Claims, 5 Drawing Sheets

ILLUMINATION UNIT HAVING AT LEAST ONE LED AS LIGHT SOURCE

TECHNICAL FIELD

The invention is based on an illumination unit having at least one LED as light source, in accordance with the preamble of claim 1. It is in particular an LED which emits in the visible or white region and is based on an LED which emits primarily UV.

BACKGROUND ART

An illumination unit having at least one LED as light source, which emits, for example, white light, is currently obtained predominantly by combining a Ga(In)N-LED, which emits in the blue at approximately 460 nm, and a yellow-emitting YAG:Ce$^{3+}$ phosphor (U.S. Pat. No. 5,998,925 and WO 98/12757). For good color rendering, two different yellow phosphors are often used, as described in WO 01/08453. A problem in this case is that the two phosphors often have different temperature characteristics, even if their structures are similar. A known example is the yellow-luminescent Ce-doped Y garnet (YAG:Ce) and the (Y,Gd) garnet which, by comparison, is luminescent at a longer wavelength. This leads to fluctuations in the color locus and changes in the color rendering at different operating temperatures.

The publication "On new rare-earth doped M—Si—Al—O—N materials" by van Krevel, TU Eindhoven 2000, ISBN 90-386-2711-4, Chapter 11 has disclosed a class of phosphor materials which are known as sialons (α-sialons), which represents a contraction of their structure, which sialons may be doped with Ce, Eu or Tb. An emission in the range from 515 to 540 nm with excitation at 365 nm or 254 nm is achieved by means of doping with Ce.

DISCLOSURE OF THE INVENTION

It is an object of the present invention to provide an illumination unit having at least one LED as light source, the LED emitting primary radiation in the range from 300 to 430 nm, this radiation being completely converted into longer-wavelength radiation by phosphors which are exposed to the primary radiation of the LED, which is distinguished by a high level of constancy at fluctuating operating temperatures. A further object is to provide an illumination unit which emits white light and in particular has a good color rendering and a high output. A preferred primary radiation of the LED is 380 to 420 nm.

This object is achieved by the following features: the conversion takes place at least with the aid of a phosphor which emits green with a peak emission wavelength at 495 to 540 nm and which originates from the class of the Ce-activation sialons, the sialon corresponding to the formula $M_{p/2}Si_{12-p-q}Al_{p+q}O_qN_{16-q}$:Ce$^{3+}$, where M=Ca individually or in combination with Sr, with q=0 to 2.5 and p=1.5 to 3. Particularly advantageous configurations are given in the dependent claims.

According to the invention, the phosphor used for the LED-based illumination unit is a sialon which emits green and originates from the class of the Ce-activated sialons, the sialon corresponding to the formula $M_{p/2}Si_{12-p-q}Al_{p+q}O_qN_{16-q}$:Ce$^{3+}$, where M=Ca individually or in combination with Sr, where q=0 to 2.5 and p=1.5 to 3. It is preferable to select a high value for p, specifically p=2.5 to 3, and a relatively low value for q, specifically q=0 to 1, in particular up to 0.8. It is preferable for Ca alone to be used for the cation M.

The Ce content, which replaces some of the cation M, should be 0.5 to 15%, preferably 1 to 10%, in particular 2 to 6%, of the M cation, so that the emission wavelength can be selected particularly accurately and the light efficiency can also be optimized. An increasing Ce content generally shifts the peak emission toward longer wavelengths.

Particular advantages of this phosphor in connection with an LED-based illumination unit are its high efficiency, its excellent thermal stability (no sensitivity to changes in the operating temperature) and a surprisingly high luminescence extinction temperature, as well as the high color rendering which can be achieved thereby, in particular in combination with at least one further phosphor. The extinction temperature, i.e. the temperature at which the luminescence is destroyed on account of the heat supplied, is even so high as to lie outside the preselected measurement range (maximum 140° C.).

A further advantage of this class of phosphors is that the starting material (in particular $Si_3N_4$) is already present in extremely finely dispersed form. Consequently, this phosphor no longer has to be milled, which eliminates one operation without any losses in efficiency. Typical mean grain sizes of the phosphor are 0.5 to 5 μm. By contrast, conventional phosphors, such as YAG:Ce, have to be milled, so that they remain dispersed in the casting resin and do not sink to the bottom. This milling operation often leads to loss of efficiency. Despite having a fine grain size of the starting material, the phosphor according to the invention has good absorption.

In addition to the production of a colored light source by excitation by means of UV radiation from an LED, in particular the generation of white light with the aid of this phosphor offers advantages. This is achieved with an UV-emitting LED as primary light source by using at least three phosphors.

White light with good color rendering is achieved in particular by the combination of an UV LED (primary emission at 300 to 430 nm, preferably 380 to 420 nm), a green phosphor according to the invention (emission between 495–540 nm) and a blue-(emission: 440–480 nm) and a red-emitting phosphor (emission: 560–620 nm).

The green phosphor used is $M_{p/2}Si_{12-p-q}Al_{p+q}O_qN_{16-q}$:Ce$^{3+}$. In this formula, M=Ca individually or in combination with Sr, and the Sr content is preferably less than 30 mol %. This green phosphor has an excellent thermal stability and very good luminescence at relatively high temperatures which are typical of LEDs: up to 80° C., it does not show any drop in luminescence within the scope of the measurement accuracy. By contrast, the conventional garnet phosphors have a significantly measurable drop in luminescence at 80° C.: this drop may be 5 to 30%, depending on the selected cation composition in the system $(Y,Gd,Lu)_3(Al,Ga)_5O_{12}$.

The major advantages of Ce sialons are their excellent stability with respect to hot acids, lyes and also their thermal and mechanical stability. Surprisingly, these sialons have an excellent temperature extinction of the luminescence from activator ions in these compounds. This makes these compounds strong competitors for phosphors which sometimes illuminate more brightly and/or efficiently at room temperature but in use have a luminescence loss through temperature extinction. For example, $Sr_4Al_{14}O_{25}$:Eu$^{2+}$, which illuminates blue-green, has a quantum efficiency of approximately 85% at room temperature. At 100° C., however, the efficiency has fallen to approximately 60%. Depending on its cation composition ($MGa_2S_4$:Eu$^{2+}$), thiogallates doped with Eu$^{2+}$ may luminesce throughout the entire green region but likewise lose 20%–30%. Yellow-luminescing $Ce^{3+}$-doped garnets lose approximately 10–30% of the room temperature efficiency at elevated temperature, depending on the proportion of Gd:Y and Al:Ga.

A white mixture can also be produced on the basis of an UV-emitting LED by means of these Ce-doped sialons together with a blue phosphor, such as for example $BaMgAl_{10}O_{17}:Eu^{2+}$ (BAM), $Ba_5SiO_4(Cl, Br)_6:Eu^{2+}$, $CaLa_2S_4:Ce^{3+}$ or $(Ca,Sr,Ba)_5(PO_4)_3Cl:Eu^{2+}$ (SCAP). A further constituent is a red phosphor, such as $(Y,La,Gd,Lu)_2O_2S:Eu^{3+}$, $SrS:Eu^{2+}$ or $Sr_2Si_5N_8:Eu^{2+}$.

If necessary, the color rendering can be improved still further by adding a further green phosphor with a shifted emission maximum (for example Eu-doped thiogallates or Sr aluminates). A further possibility is for the Ce-doped sialon to be used as the only phosphor for achieving an LED with colored emission.

Depending on the $Ce^{3+}$ content, the body color of this material, in particular at a low oxygen content, is almost white through pale green to dark green. On account of the excellent temperature stability and also mechanical stability, this Ce sialon is eminently suitable for use as an environmentally friendly green pigment or phosphor for a very wide range of applications. This applies in particular if M is replaced by 5 to 10% Ce.

In general, the lower q and the higher p are selected to be, the higher the quantum efficiency becomes. A phosphor with M=Ca, p=3 and q=0 is particularly preferred.

The light which the phosphor according to the invention emits under UV light is highly unsaturated green, with color coordinates of x~0.22/y~0.41. However, the luminescence is dependent on the $Ce^{3+}$ content: the emission shifts toward longer wavelengths as the $Ce^{3+}$ content rises.

Surprisingly, the optical properties differ from those of the sialons described in the literature, at least with a low oxygen content (below 5 mol % of the nitrogen content, preferably below 2 mol %) and a high cation content (p=1.5 to 3). The samples are often white to greenish white and therefore do not absorb in the blue region and luminesce at considerably shorter wavelengths than those described in the literature. This means that the phosphor according to the invention is very eminently suitable for UV LEDs (or if appropriate UV applications), and that in particular it does not have any competing absorption of blue light, so that a relatively long-wave UV primary emission (380 to 420 nm) can be selected. The longer the wavelength which it is possible to select for the UV emission, the lower the amount of energy consumed becomes and the more gentle the process is on the LED, which extends the surface life. In particular phosphors which contain little or no oxygen, i.e. up to at most 5 mol %, based on nitrogen, corresponding to the formula $M_{p/2}Si_{12-p-q}Al_{p+q}O_qN_{16-q}:Ce^{3+}$, where M=Ca individually or in combination with Sr, in particular where q=0 to 0.7 and p=2.5 to 3, have these advantageous characteristics.

BRIEF DESCRIPTION OF THE DRAWINGS

The invention is to be explained in more detail below with reference to a plurality of exemplary embodiments. In the drawing.

BEST MODE FOR CARRYING OUT THE INVENTION

Figure 1:
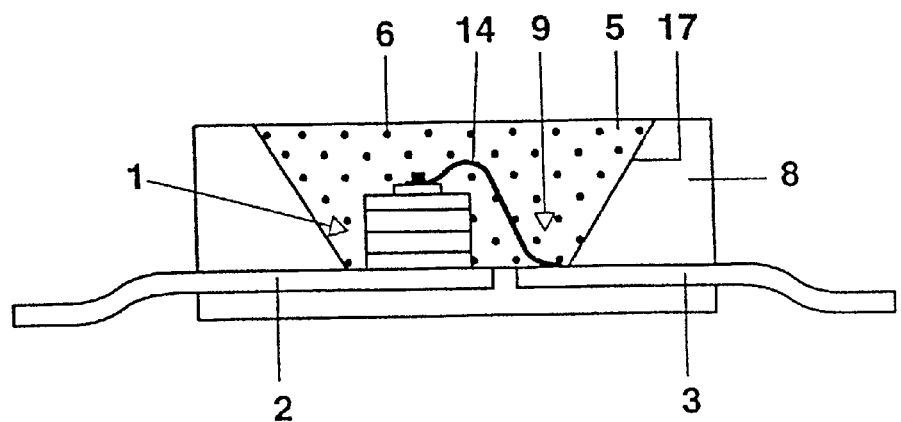
FIG. 1 shows a semiconductor component which is used as light source (LED) for white light.

For use in a white LED together with a GaInN chip, by way of an example a structure which is similar to that described in U.S. Pat. No. 5,998,925 is used. The structure of a light source of this type is shown specifically for white light in FIG. 1. The light source is a semiconductor component (chip 1) of type InGaN, with a peak emission wavelength of 400 nm, having a first and a second electrical connection 2, 3, which are embedded in an opaque base housing 8 in the region of a recess 9. One of the connections 3 is connected to the chip 1 via a bonding wire 14. The recess has a wall 17 which serves as reflector for the primary radiation of the chip 1. The recess 9 is filled with a potting compound 5 which as its main constituents contains an epoxy casting resin (80 to 90% by weight) and phosphor pigments 6 (less than 15% by weight). There are also further small amounts of, inter alia, methyl ether and Aerosil. The phosphor pigments are a mixture of BAM, SrS and sialon pigments.

Figure 2:
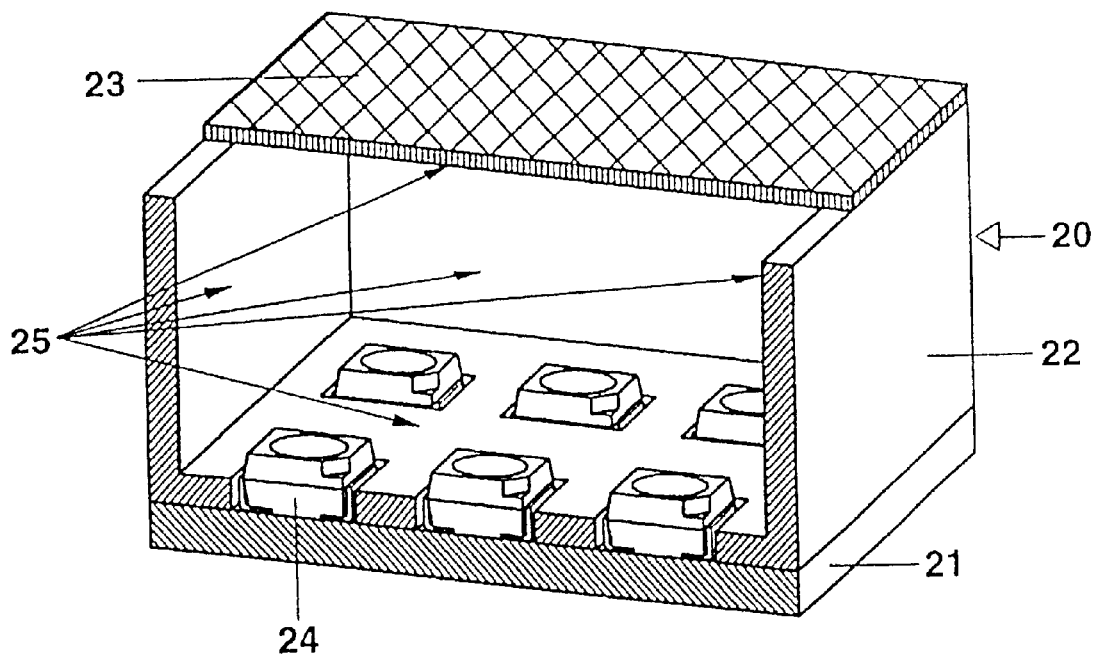
FIG. 2 shows an illumination unit with phosphors in accordance with the present invention.

FIG. 2 shows part of a surface-lighting fitting 20 as illumination unit. It comprises a common support 21, to which a cuboidal outer housing 22 is adhesively bonded. Its upper side is provided with a common cover 23. The cuboidal housing has cutouts in which individual semiconductor components 24 are accommodated. They are UV-emitting LEDs with a typical peak emission of 360 nm. The conversion into white light takes place by means of conversion layers which are positioned directly in the casting resin of the individual LEDs, in a similar manner to that described in FIG. 1, or layers 25 which are arranged on all surfaces which are accessible to the UV radiation. These include the inner surfaces of the side walls of the housing, of the cover and of the base part. The conversion layers 25 consist of three phosphors which emit in the yellow, green and blue spectral regions using the phosphors according to the invention.

A number of phosphors of the sialon type are compiled in Table 1. These are Ca sialons of type $Ca_{1.5}Si_9Al_3N_{16}$, where a proportion of the cation Ca which is between 2 and 8 mol % of the Ca has been replaced by Ce. Typical quantum efficiencies of these phosphors are 50 to 70%, with the peak emission (max. em.) of 497 nm when the Ce doping is low shifting to approximately 508 nm when the Ce doping is high. This behavior of oxygen-free sialons is particularly surprising since the literature cited in the introduction gives peak emissions at considerably longer wavelengths. It is assumed that in this context the oxygen content has a considerable effect. According to the invention, therefore, an oxygen-free pigment of the Ce sialon type is also claimed, with its peak emission in the range from 495 to 510 nm.

FIGS. 3 to 5 show the emission and reflection of various sialons as a function of the wavelength.

Figure 3A:
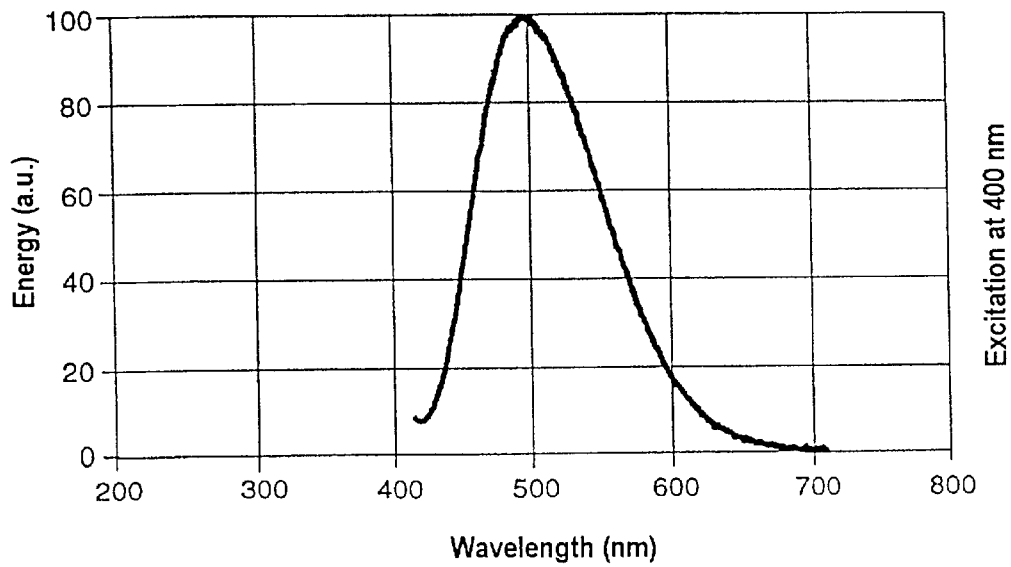
FIGS. 3 to 5 show the emission spectrum and the reflection spectrum of various sialon phosphors in accordance with the present invention.
Figure 3B:
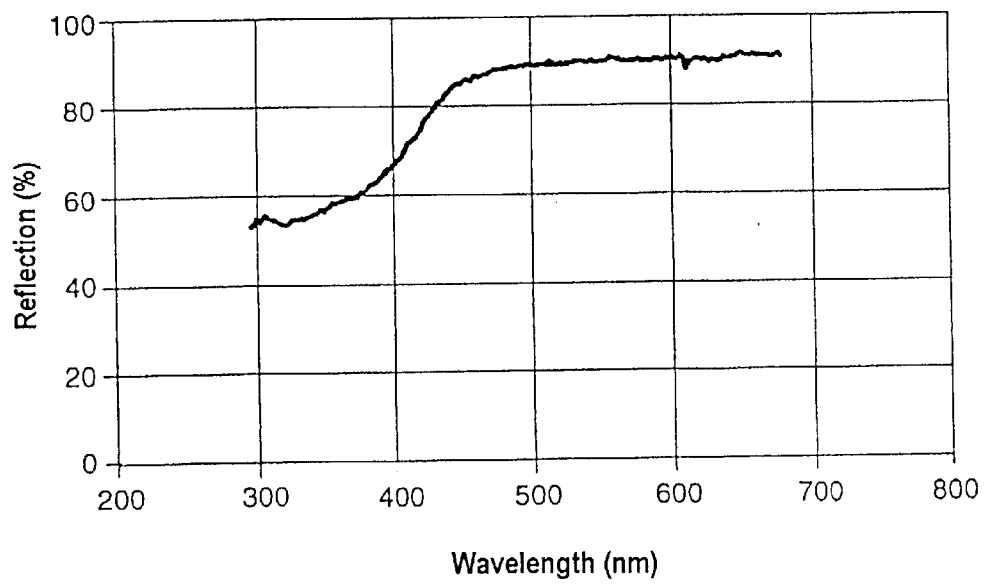

Specifically, FIG. 3a shows the emission spectrum of the sialon $Ca_{1.5}Al_3Si_9N_{16}:Ce^{3+}$ (2.7 mol % of Ce in the cation Ca) (test number HU18A/01) with excitation by 400 nm. The maximum is at 499 nm, and the mean wavelength at 517 nm. The quantum efficiency QE of specific samples was 61 to 71%, depending on the details of the preparation. The reflection (FIG. 3b) at 400 nm is approximately R400=66% and at 360 nm is approximately R360=57%. This data is also listed in Table 1.

The synthesis of the sialon HU18A/01 is described more accurately below, by way of example.

The phosphor powder is produced by means of a high-temperature solid-state reaction. For this purpose by way of example, the high-purity starting materials $Ca_3N_2$, AlN and $Si_3N_4$ are mixed, with a molar ratio of 1.44:3:9. The grain size of the $Si_3N_4$ is $d_{50}=1.6$ μm, with $d_{10}=0.4$ and $d_{90}=3.9$ μm. For the purpose of doping, a small quantity of $CeO_2$ (or for example also Ce nitride) is added, replacing the corresponding molar amount of $Ca_3N_2$. If the Ce amounts to 2.7 mol %, this corresponds to the imperical formula $(Ca_{1.46}Ce_{0.04})Al_3Si_9N_{16}$. On account of the addition of oxygen together with the Ce as Ce oxide, the precise empirical formula is to be considered to be $(Ca_{1.46}Ce_{0.04})Al_3Si_9O_{0.045}N_{15.97}$.

After the individual components have been intimately mixed, the powder is heated at approx. 1700° C. for approximately 2 h in a reducing atmosphere ($N_2/H_2$) and thereby reacts to form the compound described above.

Figure 4A:
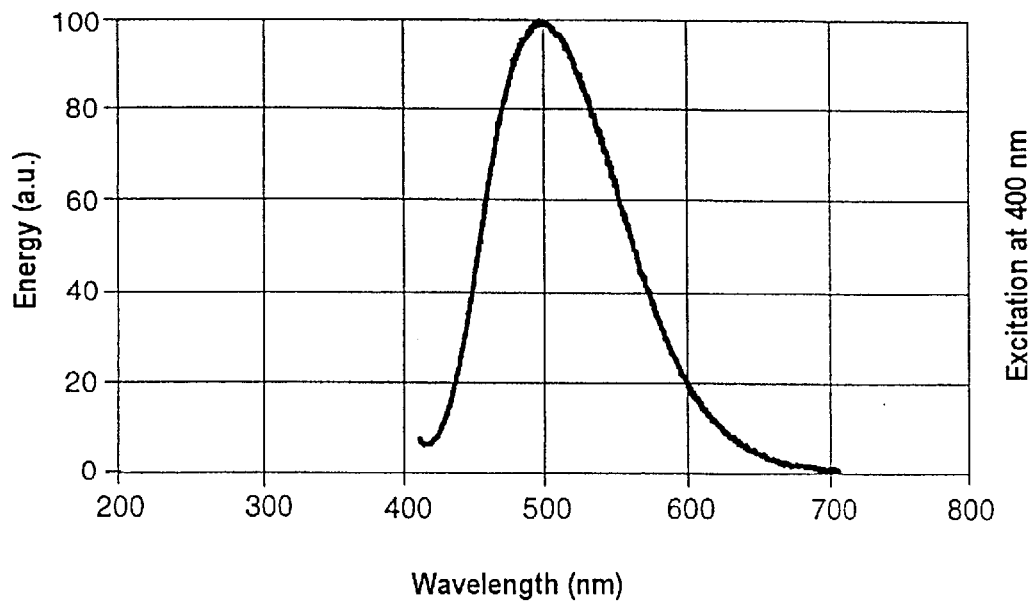
Figure 4B:
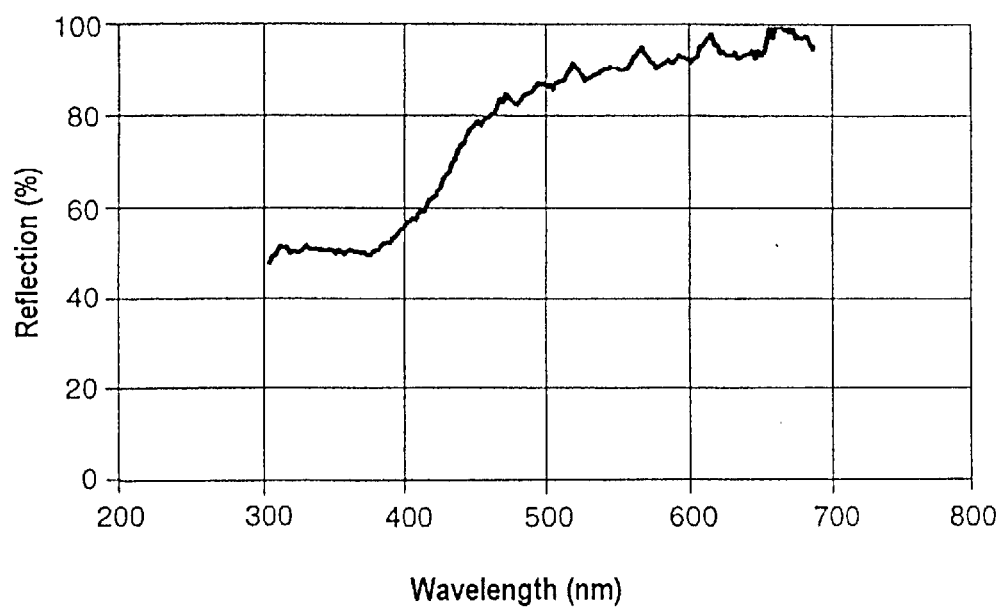

FIG. 4 shows the emission spectrum (FIG. 4a) of the sialon $Ca_{1.5}Al_3Si_9N_{16}:Ce^{3+}$ (5%) (test number HU31/01) with excitation by 400 nm. The maximum is at 498 nm, the mean wavelength at 520 nm. The quantum efficiency QE is 53%. The reflection (FIG. 4b) is approximately R400=55% at 400 nm and approximately R360=48% at 360 nm.

Figure 5A:
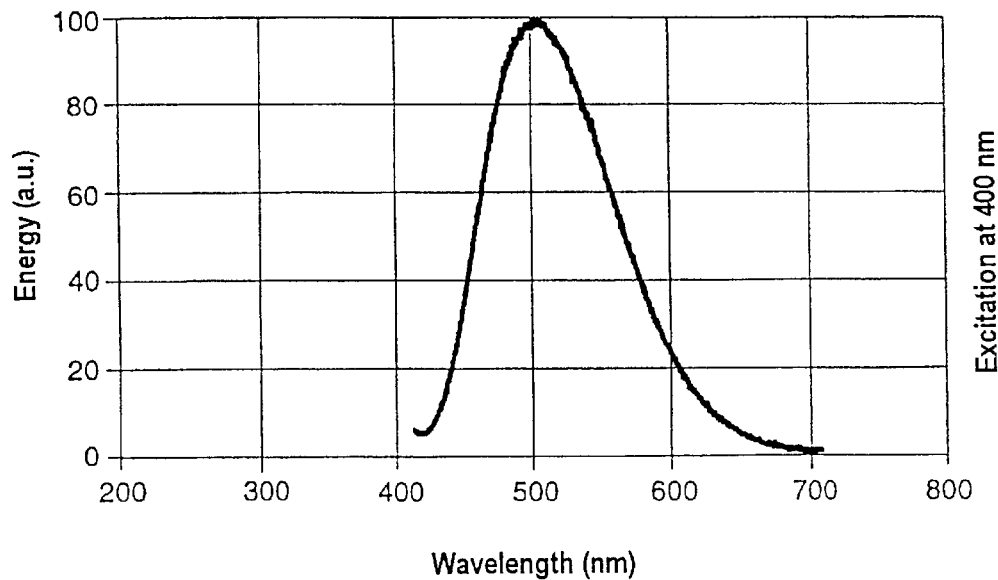
Figure 5B:
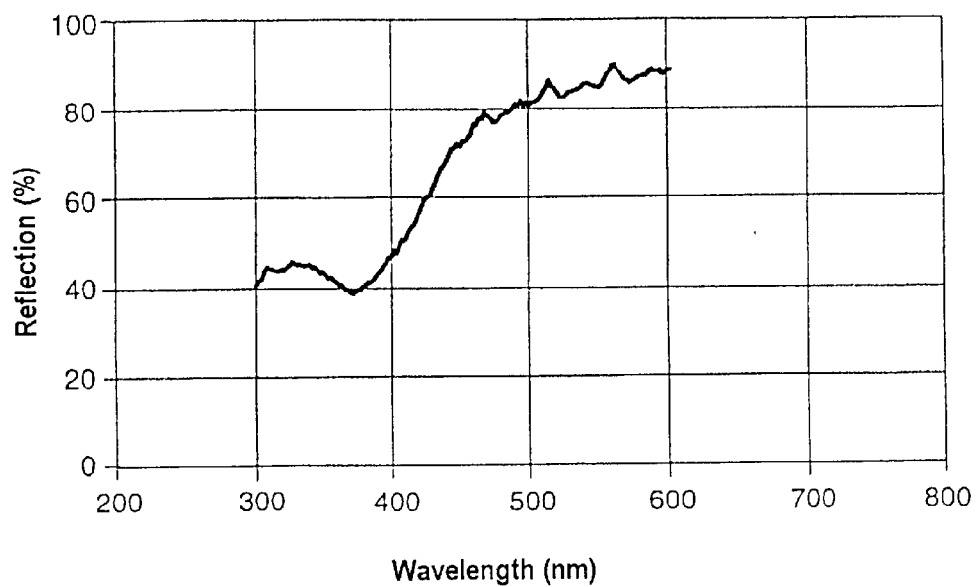

FIG. 5 shows the emission spectrum (FIG. 5a) for the sialon $Ca_{1.5}Al_3Si_9N_{16}:Ce^{3+}$ (8%) (test number HU32/01) with excitation by 400 nm. The maximum is at 508 nm, the mean wavelength at 523 nm. The quantum efficiency QE is 45%. The reflection (FIG. 5b) is approximately R400=48% at 400 nm and approximately R360=40% at 360 nm.

Figure 6:
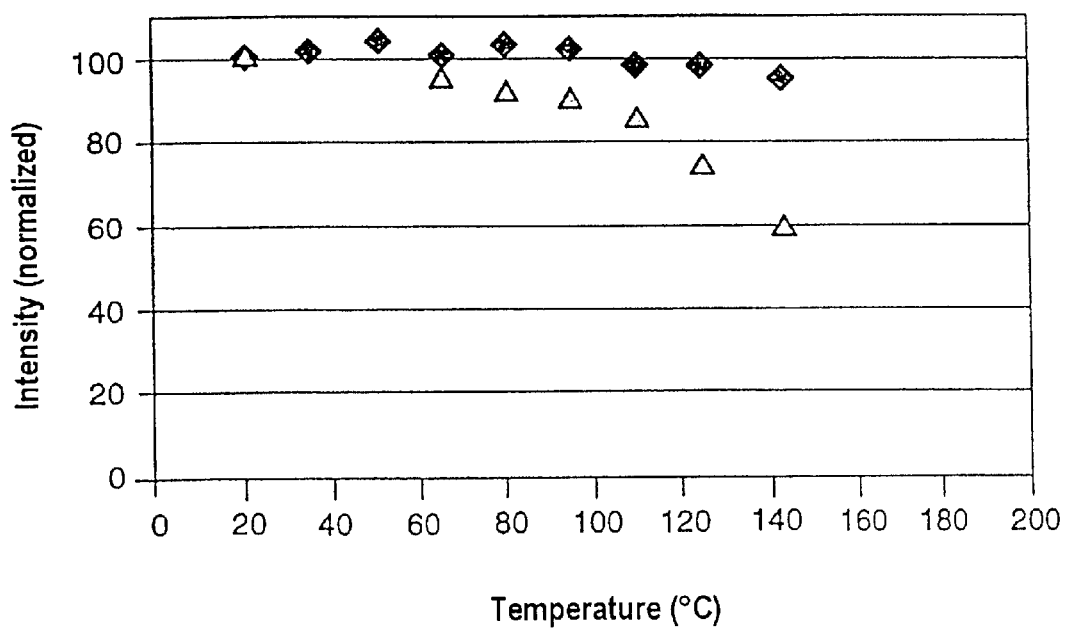
FIG. 6 shows the temperature behavior of sialon HU18A/01 and the temperature behavior of thiogallate phosphor for comparison.

FIG. 6 shows the quantum efficiency as a function of the temperature for various phosphors. It can be seen that it is true that the green-emitting thiogallate $SrGa_2S_4$:Eu, which is known per se (curve represented by triangles) has a similar quantum efficiency (normalized to 100% at room temperature) to a typical sialon (curve represented by diamond shapes: in this case HU18A/01 from Table 1). The value 100% in each case corresponds in absolute terms to a quantum efficiency of approximately 66%. Surprisingly, the quantum efficiency of the thiogallate deteriorates significantly when the LED is operating under typical temperature loads of 80° C. to 100° C., while the Ce-doped sialon phosphor maintains an almost constant quantum efficiency. Therefore, while a Ce-doped sialon phosphor at first glance appears to deliver only average results (at room temperature), its suitability for lucoleds and other thermally loaded illumination units, under load, is directly comparable even to the YAG:Ce used as standard.

This demonstrates the particular suitability of the Ce-doped sialons for use in luminescence conversion LEDs and in particular in phosphor mixtures together with other temperature-stable phosphors, such as for example SrS.

TABLE 1

| Compound | Short designation | QE | R360 | R400 | Max. em. | x | y |
|---|---|---|---|---|---|---|---|
| Ca1.5Al3Si9N16: Ce3+ (2.7%) | HU18A/01 | 66 | 57 | 66 | 499 | 0.220 | 0.396 |
| Ca1.5Al3Si9N16: Ce3+ (5%) | HU31/01 | 53 | 48 | 55 | 498 | 0.237 | 0.422 |
| Ca1.5Al3Si9N16: Ce3+ (8%) | HU32/01 | 45 | 40 | 48 | 508 | 0.247 | 0.435 |
| Ca1.5Al3Si9N16: Ce3+ (2.7%) | HU18/01 | 61 | 55 | 67 | 497 | 0.225 | 0.397 |

What is claimed is:

1. An illumination unit having at least one LED as light source, the LED emitting primary radiation in the range from 300 to 430 nm, in particular 380 to 420 nm, this radiation being completely converted into longer-wave radiation by phosphors which are exposed to the primary radiation of the LED, wherein the conversion takes place at least with the aid of a phosphor which emits green with a peak emission wavelength at 495 to 540 nm and which originates from the class of the Ce-activation sialons, the sialon corresponding to the formula $M_{p/2}Si_{12-p-q}Al_{p+q}O_qN_{16-q}:Ce^{3+}$, where M=Ca individually or in combination with Sr, with q=0 to 2.5 and p=1.5 to 3.

2. The illumination unit as claimed in claim 1, wherein the Ca is partially (up to 30 mol %) replaced by Sr.

3. The illumination unit as claimed in claim 1, wherein q<1, in particular q≦0.8, and/or p=2.5 to 3 is selected.

4. The illumination unit as claimed in claim 1, wherein the mean grain diameter of the green phosphor is between 0.5 and 5 μm.

5. The illumination unit as claimed in claim 1, wherein, to generate white light, the primary radiation emitted is in the wavelength range from 370 to 420 nm, the primary radiation emitted being exposed to at least 3 phosphors with an emission maximum in the blue (430 to 470 nm), green (495 to 540 nm) and red (in particular 540 to 620 nm) for conversion.

6. The illumination unit as claimed in claim 5, wherein the further, red phosphor is an Eu-doped sialon.

7. The illumination unit as claimed in claim 1, wherein, to generate colored light, the primary radiation emitted lies in the UV wavelength range from 370 to 420 nm, the primary radiation emitted being exposed to a single phosphor with an emission maximum in the green (495 to 540 nm) as described in one of the preceding claims 1 to 4.

8. The illumination unit as claimed in claim 5, wherein the proportion of the green phosphor in the mixture is approximately 0.5 to 15%.

9. The illumination unit as claimed in claim 1, wherein the primary radiation source used is a light-emitting diode which emits at a short wavelength and is based in particular on Ga(In)N.

10. The illumination unit as claimed in claim 1, wherein the illumination unit is a luminescent conversion LED, in which the phosphors are in direct or indirect contact with the chip.

11. The illumination unit as claimed in claim 1, wherein the illumination unit is an array of LEDs.

12. The illumination unit as claimed in claim 1, wherein at least one of the phosphors is applied to an optical device arranged in front of the LED array.

13. A phosphor from the class of the Ce-doped sialons, wherein the Ce-doped sialon corresponds to the formula $M_{p/2}Si_{12-p-q}Al_{p+q}O_qN_{16-q}:Ce^{3+}$, where M=Ca individually or in combination with Sr, where q=0 to 0.8 and p=1.5 to 3.

* * * * *